United States Patent
Liu et al.

(10) Patent No.: US 12,442,489 B2
(45) Date of Patent: Oct. 14, 2025

(54) ADJUSTABLE MOUNTING BRACKET ASSEMBLY FOR MOUNTING AN ELECTRONIC DEVICE TO A CEILING SUSPENSION SYSTEM

(71) Applicant: HEWLETT PACKARD ENTERPRISE DEVELOPMENT LP, Spring, TX (US)

(72) Inventors: Aijun Liu, Beijing (CN); Marten Harms, Santa Clara, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 151 days.

(21) Appl. No.: 18/307,194

(22) Filed: Apr. 26, 2023

(65) Prior Publication Data
US 2024/0360955 A1    Oct. 31, 2024

(51) Int. Cl.
*F16M 13/02* (2006.01)
*F16M 11/04* (2006.01)

(52) U.S. Cl.
CPC ........ *F16M 13/027* (2013.01); *F16M 11/043* (2013.01)

(58) Field of Classification Search
CPC ... F16M 13/027; F16M 11/043; F16M 11/041
See application file for complete search history.

(56) References Cited

U.S. PATENT DOCUMENTS

| | | | | |
|---|---|---|---|---|
| 4,603,829 A | * | 8/1986 | Koike | H05K 5/0204 248/657 |
| 5,524,860 A | * | 6/1996 | Ives | F04B 39/12 62/465 |

(Continued)

FOREIGN PATENT DOCUMENTS

WO    WO-2008068946 A1 *  6/2008  ........... F16M 11/041

OTHER PUBLICATIONS

Cisco Systems Inc access point mounting instructions revised date: Jun. 29, 2022, https://www.cisco.com/c/en/us/td/docs/wireless/access_point/mounting/guide/apmount.html (Year: 2022).*

(Continued)

*Primary Examiner* — Terrell L McKinnon
*Assistant Examiner* — Ding Y Tan
(74) *Attorney, Agent, or Firm* — Hewlett Packard Enterprise Patent Department

(57) ABSTRACT

AB/or mounting an electronic device to a ceiling suspension system is disclosed. The adjustable mounting bracket assembly includes clips, a device holder, and a base component having a plurality of first apertures. The clips are disposed spaced apart from each other and configured to engage with opposite edges of a beam of the ceiling suspension system. Each clip includes locking knobs, where each of the locking knobs is configured to be received within one of the plurality of first apertures to attach the clips to the base component, and the plurality of first apertures are arranged to allow the clips to be attached to the base component in a plurality of configurations including different separation distances between the clips. The device holder is coupled to the base component, where the device holder is configured to mount the electronic device to the adjustable mounting bracket assembly.

20 Claims, 14 Drawing Sheets

(56) References Cited

U.S. PATENT DOCUMENTS

| | | | |
|---|---|---|---|
| 7,066,435 B2 | 6/2006 | Oddsen, Jr. et al. | |
| 9,161,465 B2 * | 10/2015 | Chen | H05K 5/0204 |
| 10,533,703 B1 * | 1/2020 | Nguyen | F16M 13/027 |
| 10,648,615 B1 * | 5/2020 | Conklin | F16M 13/027 |
| 10,774,985 B1 * | 9/2020 | Ortel | F16M 11/041 |
| 11,158,927 B1 * | 10/2021 | Rosenthal | H01Q 1/1221 |
| 11,619,086 B2 * | 4/2023 | Wu | E05D 15/0652 |
| | | | 248/343 |
| 11,647,107 B2 * | 5/2023 | Chiang | H04M 1/04 |
| | | | 248/231.85 |
| 11,725,775 B1 * | 8/2023 | Rosenthal | E04B 9/006 |
| | | | 248/156 |
| 11,885,461 B2 * | 1/2024 | Zlotnikov | F16M 13/027 |
| 2010/0288554 A1 | 11/2010 | Jafari | |
| 2014/0117186 A1 * | 5/2014 | Govindasamy | F16M 11/16 |
| | | | 248/317 |
| 2018/0031178 A1 * | 2/2018 | Wu | F16F 1/14 |
| 2018/0116059 A1 * | 4/2018 | Wu | F16M 13/027 |
| 2022/0087065 A1 * | 3/2022 | Nguyen | H05K 7/20336 |
| 2022/0268437 A1 | 8/2022 | Leggett et al. | |
| 2022/0279672 A1 * | 9/2022 | Huang | H05K 7/1474 |

OTHER PUBLICATIONS

Cisco system Meraki CW9164 installation guide updated date: Nov. 8, 2022 (Year: 2022).*

Cisco Systems, Inc., "Access Point Mounting Instructions," Jun. 29, 2022, 16 pages.

Juniper Networks, Inc., "WLA Series, WLA532E Access Point Hardware Documentation," Oct. 19, 2012, 92 pages.

* cited by examiner

ADJUSTABLE MOUNTING BRACKET ASSEMBLY FOR MOUNTING AN ELECTRONIC DEVICE TO A CEILING SUSPENSION SYSTEM

BACKGROUND

Brackets are often utilized to mount one object to another object. In particular, the brackets may function as an intermediate component for mounting one or more devices to a structure. The devices may include electronic devices, such as access points (APs) or the like and the structure may include a ceiling, a wall of a datacenter environment or buildings, or the like. The bracket may be first coupled to a beam of the structure by fasteners, such as nails or screws and the devices may be later mounted to the bracket.

BRIEF DESCRIPTION OF THE DRAWINGS

Various examples will be described below with reference to the following figures.

DETAILED DESCRIPTION

Figure 1:
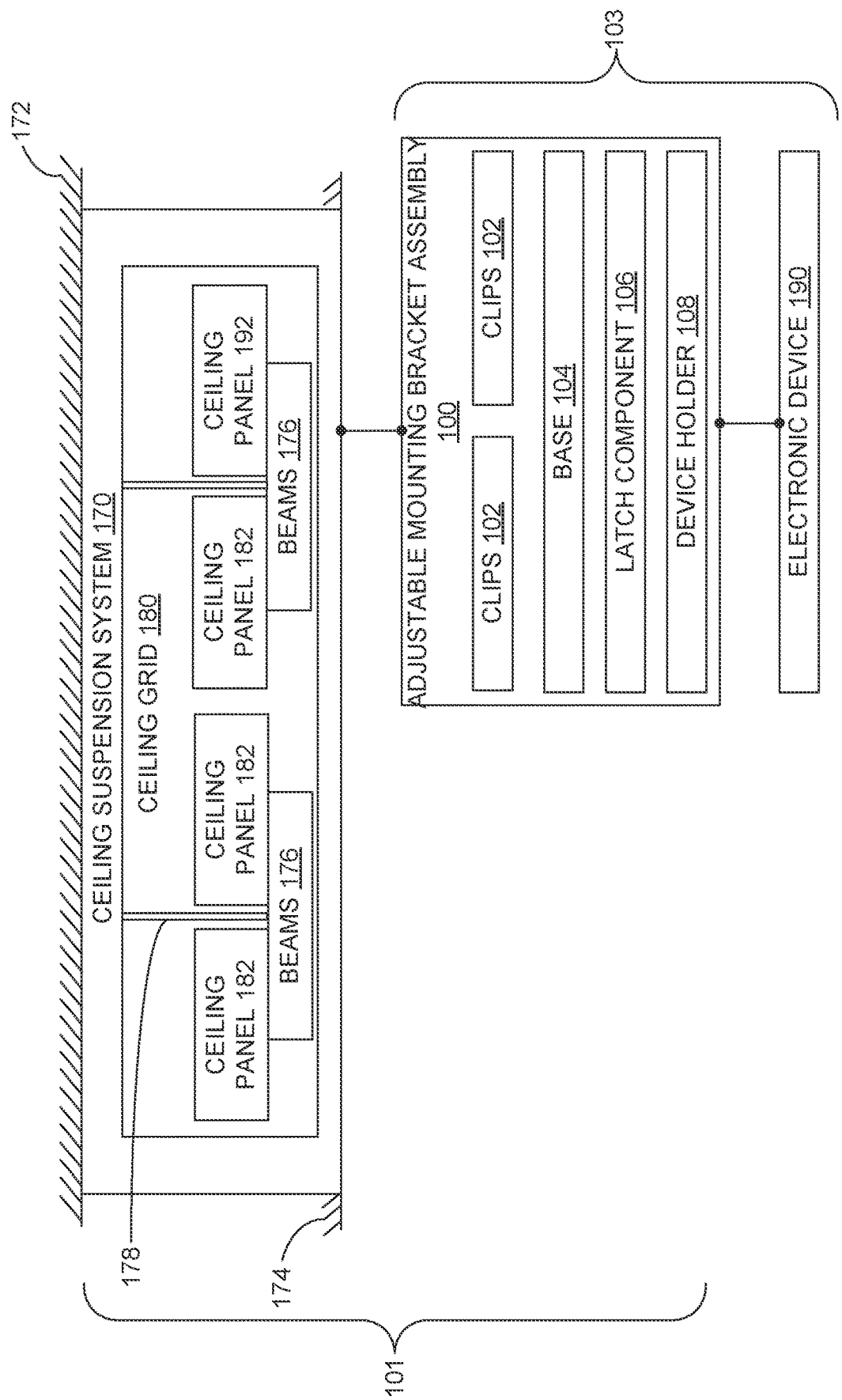
FIG. 1 illustrates a block diagram of an adjustable mounting bracket assembly for mounting an electronic device to a ceiling suspension system according to an example of the present disclosure.

The following detailed description refers to the accompanying drawings. For purposes of explanation, certain examples are described with reference to the components illustrated in FIGS. 1-7. The functionality of the illustrated components may overlap, however, and may be present in a fewer or greater number of elements and components. Moreover, the disclosed examples may be implemented in various environments and are not limited to the illustrated examples. Wherever possible, the same reference numbers are used in the drawings and the following description to refer to the same or similar parts. It is to be expressly understood, however, that the drawings are for the purpose of illustration and description only. While several examples are described in this document, modifications, adaptations, and other implementations are possible. Accordingly, the following detailed description does not limit the disclosed examples. Instead, the proper scope of the disclosed examples may be defined by the appended claims.

Some buildings have a main (structural) ceiling and then a secondary (false) ceiling suspended below the main ceiling. The secondary ceilings are often referred to as drop ceilings, grid ceilings, or suspension ceilings, and generally comprising beams suspended from the main structural ceiling. For example, the beams are typically suspended from the main ceiling via one or more hangers in a predefined pattern to define a grid of a ceiling suspension system. Such beams may provide support to a false ceiling component, e.g., a plurality of panels. Additionally, the beams may be used to mount electronic devices via a bracket. Generally, the beams are available in multiple widths and shapes depending on the type of panels e.g., tegular panel, square lay-in panel, or the like and industry standards defined in various jurisdictions. Accordingly, multiple brackets may have to be designed to suite the various widths/shapes of the beams. Hence, the utility of the bracket may get restricted to (or become dependent on) a type of beam. Therefore, customers may need to order different types of brackets for mounting the electronic device to different types of beams, and this may be cumbersome to manage. In addition, multiple different types of brackets may need to be produced, each having different types of mounting features to mount to different types of beams, and this may result in additional SKUs being needed and different inventory to be maintained, which can in turn increase costs.

A technical solution to the aforementioned problems includes providing an adjustable mounting bracket assembly, which may be assembled to accommodate multiple widths and/or shapes and/or industrial standards of a beam of a ceiling suspension system to allow mounting of an electronic device to the ceiling suspension system. Additionally, in some examples such an adjustable mounting bracket assembly may be assembled without use of any tools. In one or more examples, the adjustable mounting bracket assembly may include a pair of clips, a base component, a latch component, and a device holder. The pair of clips may be configured to mount to the beam and releasably couple to the base component via the latch component. The clips can be coupled to the base component in a plurality of different configurations that allow for different separation distances between the pair of clips. This allows the pair of clips to accommodate multiple different widths of the beams. The latch component may be coupled to the base component and movable between a latched position and an unlatched position to allow the pair of clips to be attached to the base component and removed from the base component. The device holder may be coupled to the base component and provide support to the base component. The device holder may additionally be configured to mount the electronic device to the adjustable mounting bracket assembly.

As noted above, the clips may be selectively attachable to the base component in a variety of configurations. Specifically, in some examples, each clip has locking knobs that engage with the base component and with the latch component to attach the clips to the base component. The base component includes a plurality of first apertures, and the locking knobs are received within a subset of the first apertures when the pair of clips is attached to the base component. By changing which subsets of the first apparatus the clips engage with, the configuration of the clips can be changed between the aforementioned multiple configurations. Specifically, the plurality of first apertures defines multiple distinct attachment positions that provide different separation distances between the clips, and thus the separation distance between the clips can be selectively controlled by selecting which subsets of first apertures the pair of clips engage with. Thus, for example the attachment positions for the pair of clips may be selected based on the width of the beam such that the separation distance between the clips is commensurate with the width of the beam. In this manner, the adjustable mounting bracket can accommodate multiple widths of the beams. Once the locking knobs have been inserted through the first apparatus, they may be engaged by the latch component to prevent the locking knobs from being withdrawn out of the first apertures. In particular, the latch component may be slidably disposed in a pair of guide channels of the base component and movable along the pair of guide channels between a latched position in which the latch component can engage the locking knobs extending through the first apertures and an unlatched position in which the latch component is disengaged from the locking knobs. When the latch component is engaged with the locking knobs, it prevents withdrawal of the locking knobs from the first apertures, whereas when the latch component is disengaged from the locking knobs, it allows withdrawal of the locking knobs from the first apertures. In this manner, the clips are selectively attached to the base component via the first apertures and the latch component.

In some examples, the latch component includes a plurality of keyholes respectively corresponding to and aligned with the plurality of first apertures. Each keyhole includes a second aperture configured to, when the latch component is in the unlatched position, align with a corresponding one of the first apertures and receive one of the locking knobs as the locking knob is inserted through the corresponding first aperture. More specifically, the locking knobs each include a body and a head, with the head being wider than the body, and the second apertures are configured to allow insertion of the head therethrough. As the locking knob is inserted through the first and second apertures, the locking knob is moved along a first direction perpendicular to a face of the base component from which the clips extend. Each keyhole also includes an engagement slot extending from the second aperture in a second direction perpendicular to the first direction and parallel to the face of the base component. The engagement slot is aligned with the corresponding first aperture when the latch component is in the latched position. Additionally, the engagement slot is wider than the body of a locking knob but narrower than the head thereof. Thus, the body can be received within the engagement slot, but the head of the locking knob cannot pass through the engagement slot. Accordingly, after the head of a given locking knob has been inserted through the second aperture of a given keyhole, the latch component can then be moved from the unlatched position to the latched position, which causes the body of the given locking knob to slide from the second aperture into the engagement slot of the given keyhole (with the relative motion between the body and the engagement slot being along the second direction). In this state, the rim of the engagement slot of the given keyhole (and surrounding portions of the latch component) engages (i.e., abut) the head of the locking knob and prevent the head from being withdrawn through the engagement slot along the first direction. When the latch component is moved from the latched position to the unlatched position, the body of the given locking knob slides out of the engagement slot and back into the second aperture of the given keyhole, and thus the given locking knob can be withdrawn through the second aperture along the first direction. In this manner, the latch component can selectively engage with or disengage from the locking knobs to selectively secure the clips to or allow removal of the clips from the base component. Further, in some examples, the device holder may include a flange that engages with a pair of guide grooves of the electronic device to mount the electronic device to the adjustable mounting bracket assembly. Thus, the adjustable mounting bracket assembly may allow mounting of the electronic device to the ceiling suspension system. In some examples, the latch component may include a fastener, e.g., a spring-loaded pin, which may engage with a locking hole formed in the device holder, when the latch component is in latched position to retain the pair of clips to the base component. Similarly, the electronic device may include another fastener, e.g., another spring-loaded pin, which may engage with a locking opening formed in the device holder, when the electronic device is mounted to the flange to retain the electronic device to the adjustable mounting bracket.

Since the adjustable mounting bracket assembly may be easily assembled to make it compatible with multiple widths of beams, the adjustable mounting bracket provides flexibility, upgradability, serviceability, reduced costs, and supply chain benefits. In particular, there may be no need to maintain or produce different types of adjustable mounting bracket, each having different types of mounting features, and therefore the costs associated with designing and producing multiple types of brackets can be avoided. In addition, the number of SKUs that are needed can be reduced and the need to maintain different inventories thereof can be avoided, which can in turn decrease costs. Further, since the various mounting features of the adjustable mounting bracket are designed as one of sliding fixtures or spring-loaded pins, the adjustable mounting bracket may not require tools or special fixtures to mount the electronic device to the ceiling suspension system. Hence, the adjustable mounting bracket is inexpensive to assemble, maintain, and replace.

Referring to Figures, FIG. 1 depicts a block diagram of an adjustable mounting bracket assembly 100. It should be understood that FIG. 1 is not intended to illustrate specific shapes, dimensions, or other structural details accurately or to scale, and that implementations of the adjustable mounting bracket assembly 100 may have different numbers and arrangements of the illustrated components and may also include other parts that are not illustrated. In one or more examples, the adjustable mounting bracket assembly 100 may be an overhanging member attached to a suspended structure from a ceiling, a wall, or the like and provide support for a load (e.g., an electronic device, a lighting fixture, or the like). In some examples, the adjustable mounting bracket assembly 100 is attached to a ceiling suspension system 170 and is configured to provide support to the electronic device 190.

Some buildings, such as a data center (not shown), college campus building, office, retail facility, or other buildings, have a main ceiling 172 (main structure) and then a secondary ceiling 174 (false ceiling) suspended below the main ceiling 172. In particular, the secondary ceiling 174 generally includes beams 176 suspended from the main ceiling 172. For example, the beams 176 are suspended from the main ceiling 172 via one or more hangers 178 in a predefined pattern to define a ceiling grid 180 of the ceiling suspension system 170. Each beam 176 is used to provide support to false ceiling components, e.g., a plurality of ceiling panels 182. Additionally, at least some of the beams 176 are used to mount the electronic device 190 to the ceiling suspension system 170 via the adjustable mounting bracket assembly 100. Generally, beams 176 are available in multiple widths and shapes depending on the type of ceiling panels 182 (e.g., a tegular ceiling panel, a square lay-in ceiling panel, or the like) and industry standards defined in various jurisdictions. Accordingly, the adjustable mounting bracket assembly 100 has been designed to suit the various widths/shapes of the beam 176.

In some examples, the adjustable mounting bracket assembly 100 includes a pair of clips 102, a base component 104, and a latch component 106. In some examples, the adjustable mounting bracket assembly 100 also includes a device holder 108. The adjustable mounting bracket assembly 100 is configured to accommodate multiple widths/shapes of the beam 176 to allow mounting of the electronic device 190 to the ceiling suspension system 170.

In some examples, each clip 102 of the pair of clips may be disposed spaced apart from each other and engage with the beam 176 of the ceiling suspension system to allow the adjustable mounting bracket assembly 100 to suspend from the ceiling suspension system 170. Specifically, the clips 102 may engage with flanges on opposite sides of the beam 176. Each clip 102 may include a locking knob (not shown in FIG. 1), which may be configured to be received within one of a plurality of first apertures (not shown in FIG. 1) of the base component 104 to attach the clips 102 to the base component 104 of the adjustable mounting bracket assembly 100. In one or more examples, the plurality of first apertures may be arranged on the base component 104 such that they allow the pair of clips 102 to be attached to the base component 104 in a plurality of configurations (e.g., by inserting the locking knobs into different subsets of the first apertures), with at least some of the configurations including different separation distances between the pair of clips 102. Thus, the positions at which the clips 102 are attached to the base portion may be selected based on a width/shape of the beam 176 such that the clips 102 have a separation distance that is commensurate with the width of the beam.

Further, the latch component 106 may be coupled to the base component 104 and may be configured to move between a latched position and an unlatched position. In one or more examples, the latch component 106 may be configured to, in a state of the locking knobs received within the plurality of first apertures: a) engage with the locking knobs of the pair of clips 102 in the latched position to attach the pair of clips 102 to the base component 104 and b) disengage from the locking knobs in the unlatched position to allow removal of the pair of clips 102 from the base component 104.

Further, the device holder 108 may be coupled to, or configured to be couplable to, the base component 104. In some examples, the device holder 108 is fixedly (permanently) coupled to, or is an integral part of, the base component 104. In other examples the device holder 108 is removably couplable to the base component 104, for example via tabs and slots (as described below). The device holder 108 is also configured to mount the electronic device 190 to the adjustable mounting bracket assembly 100. In some examples, the device holder 108 is fixedly (permanently) coupled to, or is an integral part of, the electronic device 190. In other examples, the device holder 108 is removably couplable to the electronic device 190, for example via mounting flanges (as described below). While the device holder 108 is illustrated and described herein as a part of the adjustable mounting bracket assembly 100 for ease of description, in some examples the device holder 108 could be regarded as being a part of the electronic device 190.

In some examples, the adjustable mounting bracket assembly 100 is mounted to the beam 176 without the electronic device 190 being coupled to the adjustable mounting bracket assembly 100 at the time of mounting of the adjustable mounting bracket assembly 100 to the beam 176. In some other examples, the adjustable mounting bracket assembly 100 is coupled to the electronic device 190 prior to being mounted to the beam 176.

In examples in which the beam 176 is part of a ceiling suspension system 170, the combination of the adjustable mounting bracket assembly 100 and the ceiling suspension system 170 in a state of the adjustable mounting bracket assembly 100 mounted to the beam 176 may be referred to herein as a ceiling suspension assembly 101. In some examples, a ceiling suspension assembly 101 may be considered as a part of the building (e.g., the data center), and may be provided to allow mounting of the electronic device 190 to the main ceiling 172 via the ceiling suspension assembly 101. In particular, the ceiling suspension assembly 101 includes the ceiling suspension system 170 having the ceiling grid 180 defined by the plurality of beams 176, where each beam of the plurality of beams 176 is disposed between the pair of ceiling panels 182 to support such pair of ceiling panels 182. The ceiling suspension assembly 101 further includes the adjustable mounting bracket assembly 100, where the pair of clips 102 are configured to engage with one of the plurality of beams 176.

In some examples, the combination of the adjustable mounting bracket assembly 100 and the electronic device 190 coupled thereto may be referred to herein as a mountable electronic system 103, which may be mounted to the ceiling suspension system 170. In particular, the mountable electronic system 103 includes the adjustable mounting bracket assembly 100 and the electronic device 190 coupled to, or configured to be coupled to, the device holder 108 of the adjustable mounting bracket assembly 100.

Example configurations of the adjustable mounting bracket assembly 100, the ceiling suspension system 170, and the electronic device 190 (in the forms of adjustable mounting bracket assembly 200, the ceiling suspension system 400, and the electronic device 600) are discussed in greater details below in the examples of FIGS. 2-7.

Although the beams 176 are described above as being part of a drop ceiling, this is but one example and the adjustable mounting bracket assembly 100 can be used with beams 176 of any type of structure. For example, in some implementations the beams 176 are structural members of a main ceiling (instead of a secondary ceiling). As another example, in some implementations the beams 176 are part of a structure that is neither a main nor a secondary ceiling, such as: a wall, shelf, bulkhead, utility or HVAC conduit or supporting structure thereof, or any other structure that has a beam with which clips 120 can engage.

Turning now to FIGS. 2-7, an example adjustable mounting bracket assembly 200 will be described. The adjustable mounting bracket assembly 200 is one example configuration of the adjustable mounting bracket assembly 100 described above, but the adjustable mounting bracket assembly 100 is not limited to the adjustable mounting bracket assembly 200. FIG. 2A depicts a perspective view of the adjustable mounting bracket assembly 200. FIG. 2B depicts a perspective view of a pair of clips 202 of the adjustable mounting bracket assembly 200 of FIG. 2A. FIG. 2C depicts a perspective view of a base component 204 of the adjustable mounting bracket assembly 200 of FIG. 2A. FIG. 2D depicts a perspective view of a device holder 208 of the adjustable mounting bracket assembly 200 of FIG. 2A. FIG. 2E depicts a perspective view of a latch component 206 of the adjustable mounting bracket assembly 200 of FIG. 2A. FIG. 2F depicts a perspective view of a spring-loaded pin 210 of the adjustable mounting bracket assembly 200 of FIG. 2A. In the description hereinafter, FIGS. 2A-2F are described concurrently for ease of illustration. It should be understood that implementations of the adjustable mounting bracket assembly 200 may have different numbers and arrangements of the illustrated components and may also include other parts that are not illustrated.

Figure 2A:
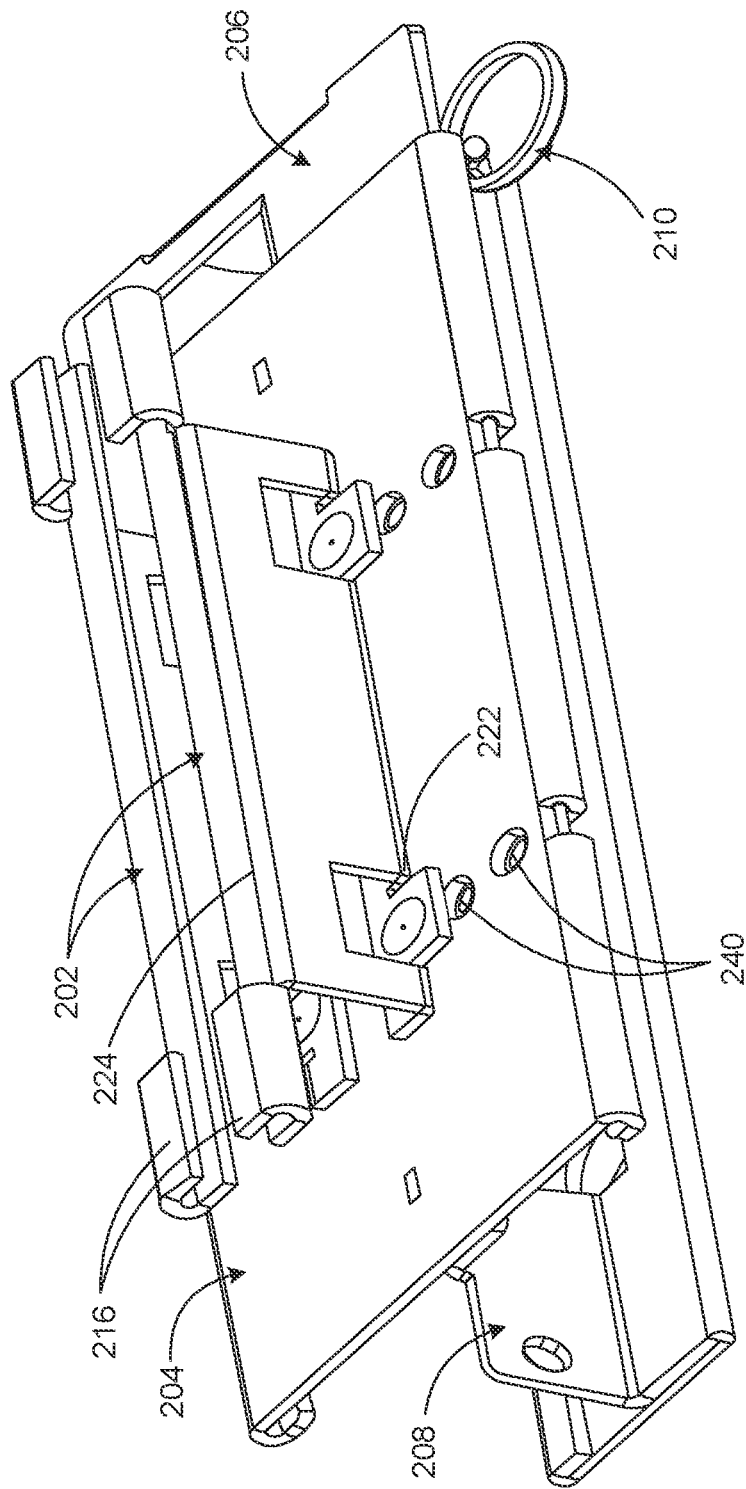
FIG. 2A illustrates a perspective view of an adjustable mounting bracket assembly according to an example of the present disclosure.
Figure 6A:
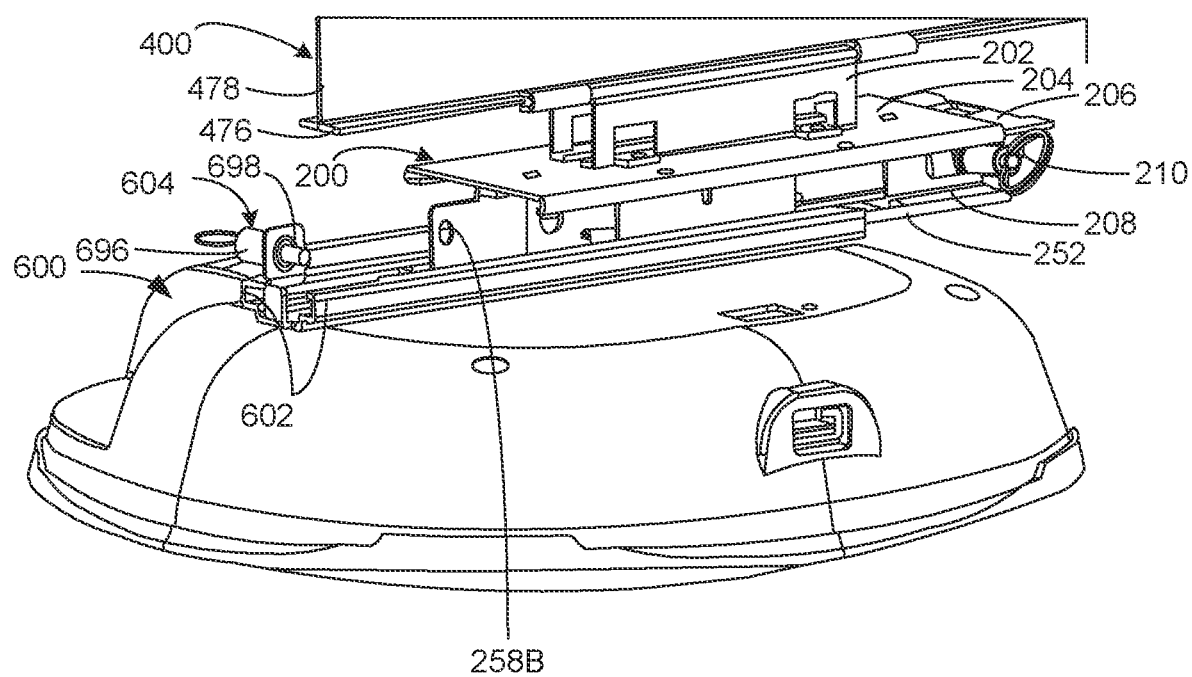
FIG. 6A illustrates a partially assembled perspective view of an electronic device to the ceiling suspension assembly of FIG. 5B according to an example of the present disclosure.

Referring to Figures, FIG. 2A, the adjustable mounting bracket assembly 200 is an overhanging member, which may be used for mounting an electronic device 600 (as shown in FIG. 6A) to a ceiling suspension system 400 (as shown in FIGS. 4A-4B). The adjustable mounting bracket assembly 200 includes the pair of clips 202, the base component 204, the latch component 206, the device holder 208, and the spring-loaded pin 210.

Figure 2B:
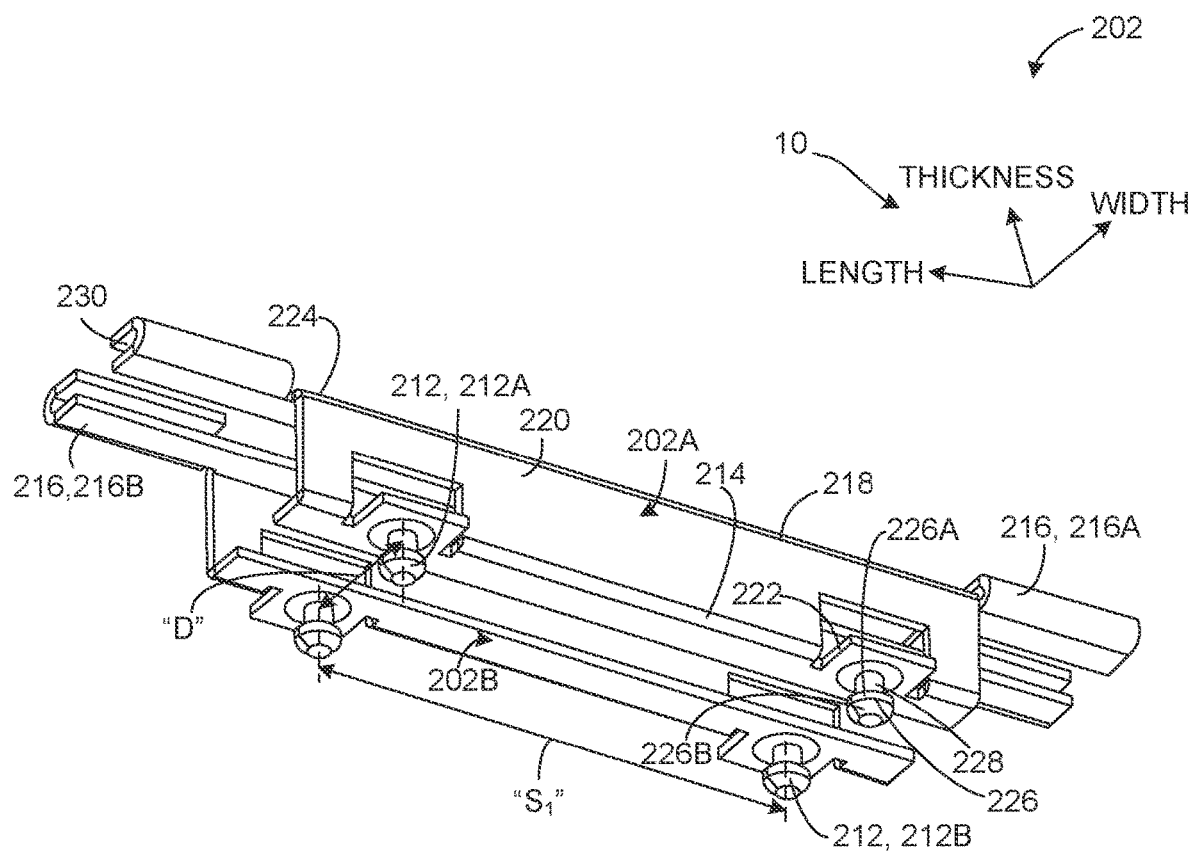
FIG. 2B illustrates a perspective view of a pair of clips of the adjustable mounting bracket assembly of FIG. 2A according to the example of the present disclosure.

Turning to FIG. 2B, the pair of clips 202 includes a first clip 202A and a second clip 202B. Each clip among the first clip 202A and the second clip 202B includes a support column 220, locking knobs 212 at a first end 214 of the support column 220, and hooks 216 a second end 218 of the support column 220. More specifically, each clip 202 may include a first end portion 222 coupled to the first end 214 of the support column 220 and a second end portion 224 coupled to the second end 218 of the support column 220, where the first and second end portions 222 and 224 extend transversely (e.g., perpendicularly) from the support column 220. The first and second end portions 222, 224 respectively may also be described herein as flanges. For example, the locking knobs 212 are formed extending from a bottom face of the first end portion 222, which faces the base component 204 when the clip 202 is coupled thereto. In one example, the second end portion 224 includes a portion that extends outwardly from the support column 220, whereas part of the second end portion 224 includes a portion that extends inwardly from the support column 220. The hooks are formed on the second end portion 224. In some examples, the second end portion 224 extends inwardly from of the support column 220.

Further, the locking knobs 212 of each clip of the pair of clips 202 are spaced apart from each other by a first distance "$S_1$" along a length of the adjustable mounting bracket assembly 200, as shown by a legend 10. Each locking knob 212 includes a head portion 226 and a body portion 228 connected to the first end portion 222. In some examples, the head portion 226 has a diameter greater than the diameter of the body portion 228. The locking knob 212 is configured to be inserted through a first aperture 240 (see FIG. 2C) of a base component 204, as described in greater detail below, and thus the diameter of the head portion 226 is smaller than a diameter of the first aperture 240. Further, the head portion 226 has a rim section 226A and a tapered section 226B. The tapered section 226B may facilitate easier insertion of the locking knob 212 through the first aperture 240.

Each hook 216 may have a U-shaped cross-section and may define a receptacle 230 or recess into which a portion of the beam (not shown) of the ceiling suspension system 400 can be received. In some examples, the first clip 202A and the second clips 202B are disposed such that hooks 216A in the first clip 202A faces hooks 216AB in the second clip 202B, and locking knobs 212A of the first clip 202A and the locking knobs 212A of the first clip 202A faces vertically downwards ("vertical" and "downward" being used herein to refer to directions parallel to the thickness dimension shown in the legend 10). When the clips 202 are attached to the base component 204, the locking knobs 212A of the first clip 202A and the locking knobs 212B of the second clip 202B are separated from each other along the width dimension by a separation distance "D". As will be described in greater detail below, this separation distance "D" is variable depending on which first apertures 240 the locking knobs 212 are inserted into.

Figure 2C:
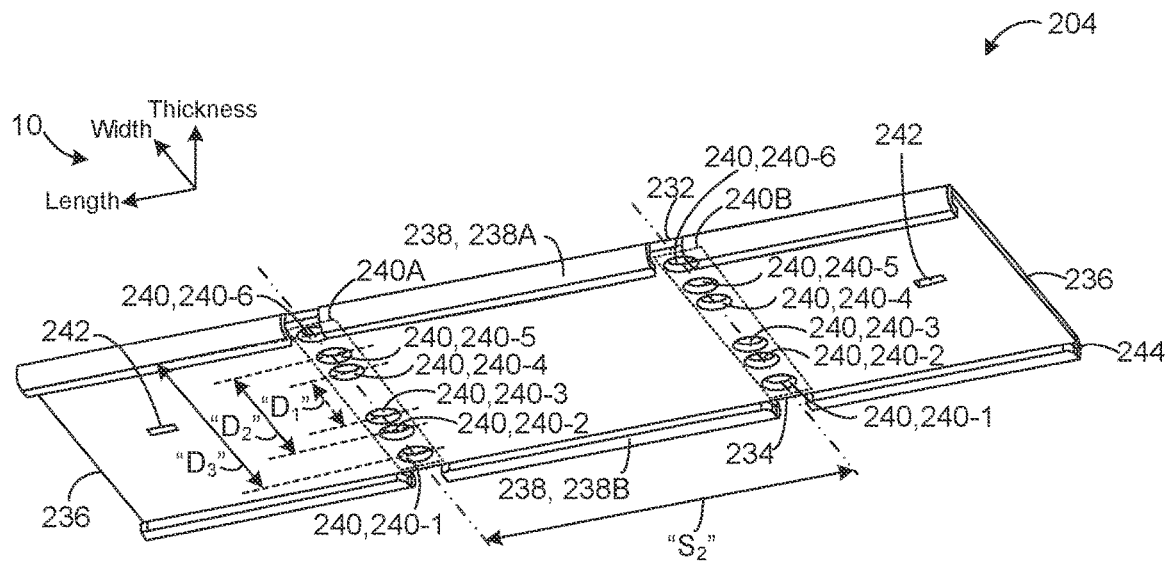
FIG. 2C illustrates a perspective view of a base component of the adjustable mounting bracket assembly of FIG. 2A according to an example of the present disclosure.

Turning to FIG. 2C, the base component 204 is configured to function as a coupler component coupling the pair of clips 202 and the device holder 208 together. For example, the base component 204 allows the pair of clips 202 to be releasably coupled to the base component 204, and the device holder 208 to be attached to the base component 204, as discussed in greater details below. In some examples, the base component 204 includes a first side portion 232, a second side portion 234, a pair of peripheral end portions 236, a pair of guide channels 238, a plurality of first apertures 240, and a plurality of slots 242.

Figure 3A:
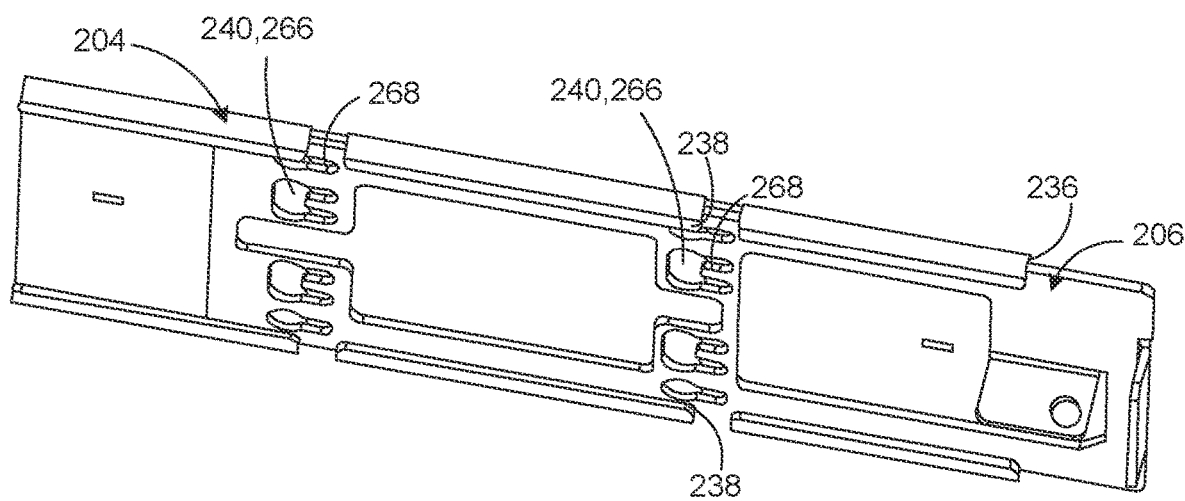
FIGS. 3A-3C illustrates a plurality of steps of assembling the adjustable mounting bracket assembly of FIG. 2A according to the example of the present disclosure.
Figure 3B:
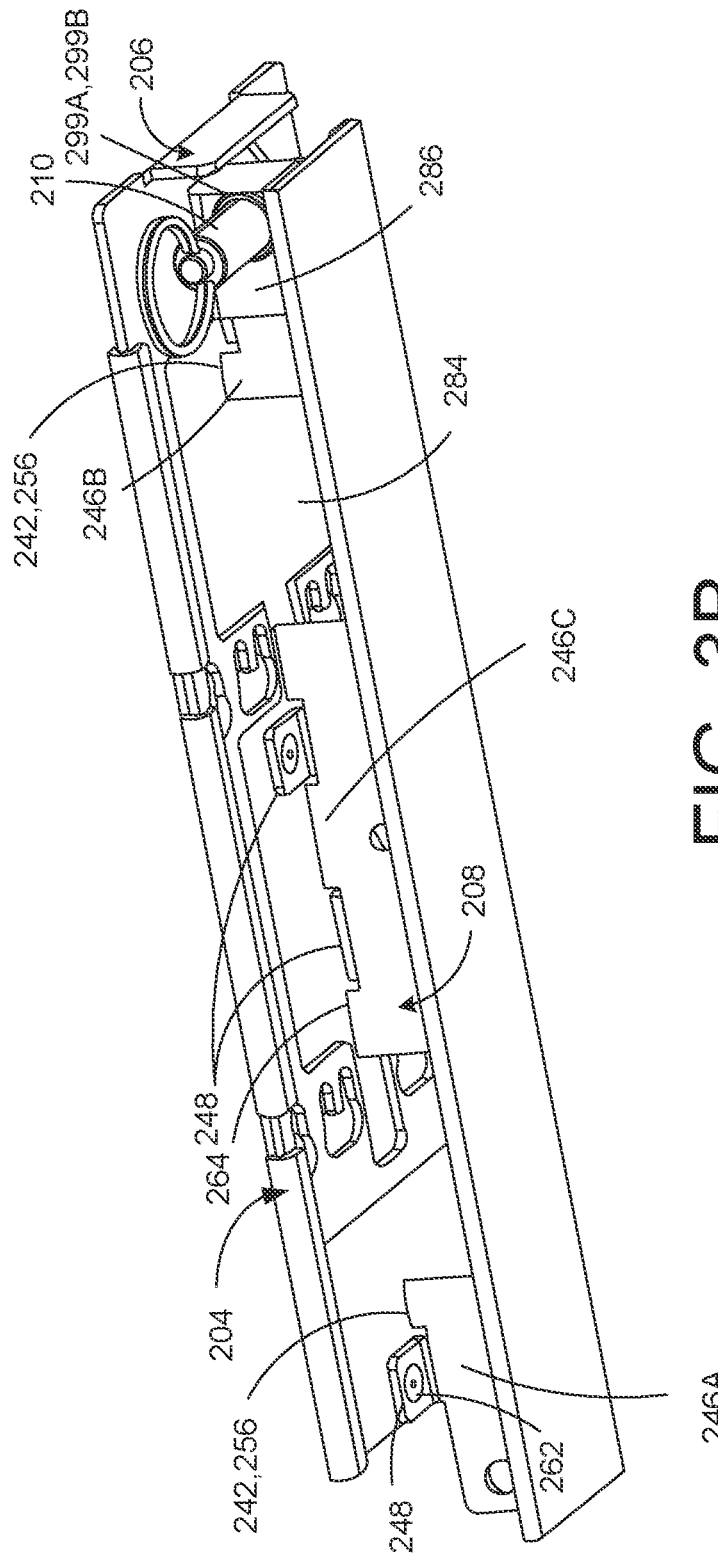
Figure 3C:
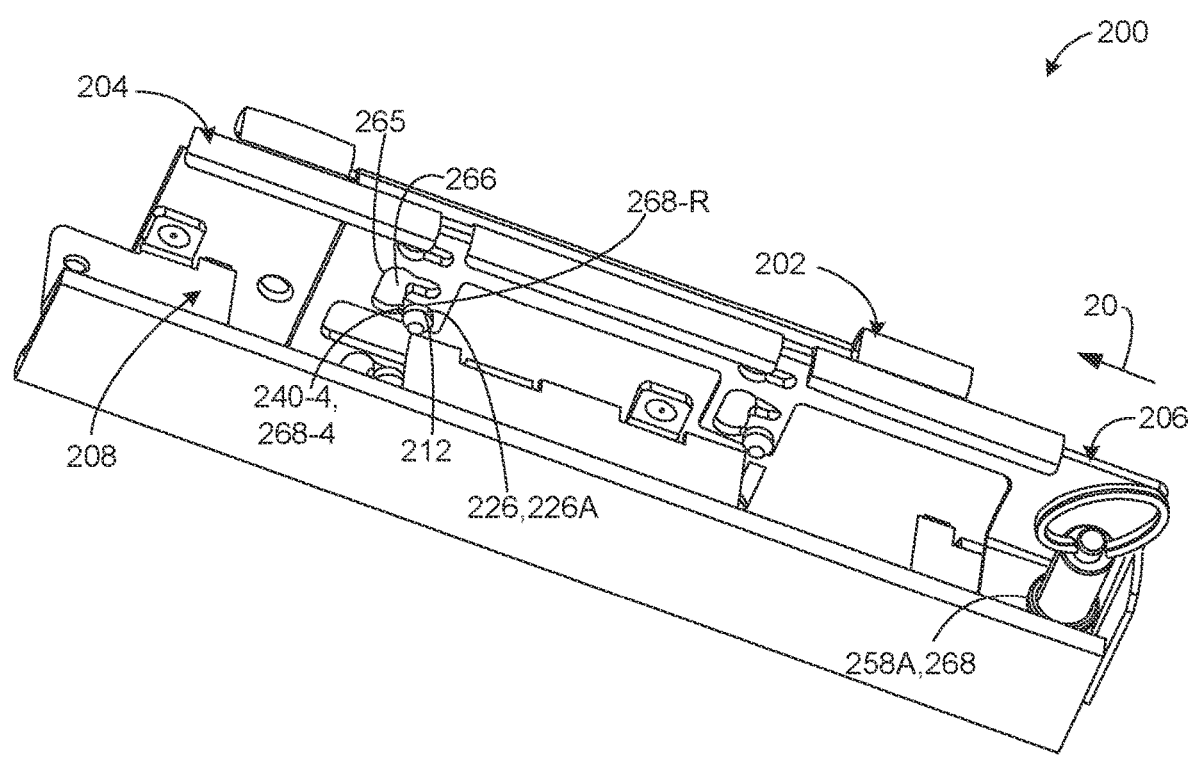
Figure 5A:
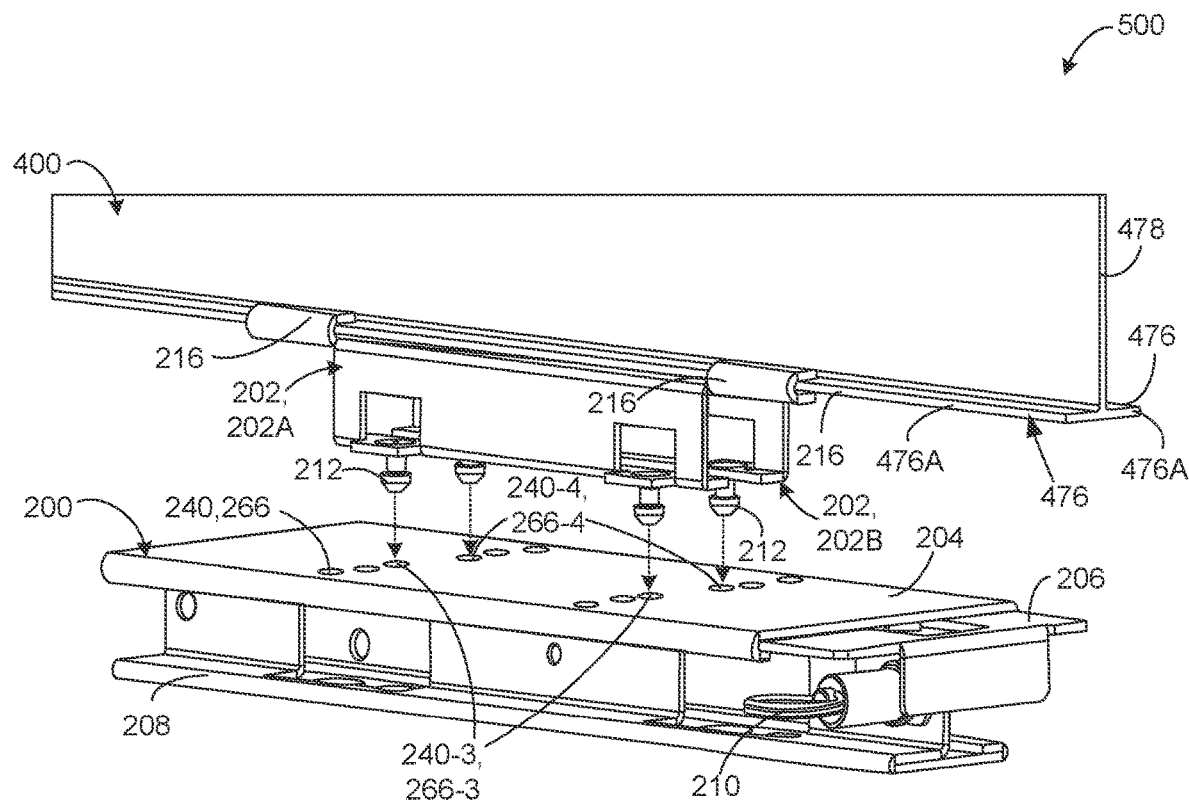
FIG. 5A illustrates an exploded perspective view of a ceiling suspension assembly according to an example of the present disclosure.

As noted above, the first apertures 240 are configured to allow the locking knobs 212 of the clips 202 to be inserted therethrough (see FIGS. 2A, 3C, and 5A). Each first aperture among the plurality of first apertures 240 has a diameter equal to or greater than a diameter of the locking knob 212, (e.g., diameter of the rim section 226A in the head portion 226 of the locking knob 212) to allow the locking knob 212 to be inserted therethrough. In addition, there are more first apertures 240 than there are locking knobs 212, and thus less than all of the first apertures 240 are utilized when the clips 202 are coupled to the base component 204. This allows the clips 202 to be selectively attached to the base component 204 at multiple possible attachment positions, each associated with a different subset of the first apertures 240. In some examples, the plurality of first apertures 240 includes a first set of first apertures 240A, and a second set of first apertures 240B, which are disposed spaced apart from each other by a second distance "$S_2$" along the length of the adjustable mounting bracket assembly 200, as shown by the legend 10. In one or more examples, the second distance "$S_2$" may be equal to the first distance "$S_1$" (as shown in FIG. 2B), and thus when a clip 202 is coupled to the base component 204, the locking knobs 212 of the clip 202 can engage with one first aperture 240 from the first set of first apertures 240A and another first aperture 240 from the second set of first apertures 240B. Further, the apertures belonging to the first set of first apertures 240A are spaced apart from each other along a width of the adjustable mounting bracket assembly 200, as shown by the legend 10. Similarly, the apertures belonging to the second set of first apertures 240B are linearly spaced apart from each other along the width of the adjustable mounting bracket assembly 200. In particular, in some examples, each first aperture 240 in the first set of first apertures 240A has a corresponding first aperture 240 in the second set of first apertures 240B, and each such pair of corresponding first apertures 240 is located at a similar position as one another along the width dimension. Moreover, these pairs of similarly positioned apertures 240 define the aforementioned multiple attachment positions at which the clips 202 can be attached to the base component 204. For example, in the example of FIG. 2C each set among the first set of first apertures 240A and the second set of first apertures 240B includes six first apertures 240, labeled 240-1 to 240-6 in the figure, forming six pairs of corresponding first apertures 240 associated with six attachment positions. Specifically, the apertures 240-1 from the first and second sets of first apertures 240A and 240B form a first pair defining a first attachment position, the apertures 240-2 from the first and second sets of first apertures 240A and 240B form a second pair defining a second attachment position, and so on for each such pair. In some examples, the apertures 240-3 and 240-4 are separated from each other by a first separation distance "$D_1$", the apertures 240-2 and 240-5 are separated from each other by a second separation distance "$D_2$", and the apertures 240-1 and 240-6 are separated from each other by a third separation distance "$D_3$".

Thus, the separation distance "D" between the locking knobs 212, which was discussed above in relation to FIG. 2B, may vary depending on which pair of first apertures 240 that each clip 202 is engaged with. For example, if one clip 202 is engaged with the apertures 240-3 and the other clip 202 is engaged with the apertures 240-4, then the separation distance "D" between the locking knobs 212 may be equal to "$D_1$". Or if one clip 202 is engaged with the apertures 240-2 and the other clip 202 is engaged with the apertures 240-5, then the separation distance "D" between the locking knobs 212 may be equal to "$D_2$". Of if one clip 202 is engaged with the apertures 240-1 and the other clip 202 is engaged with the apertures 240-6, then the separation distance "D" between the locking knobs 212 may be equal to "$D_3$". Although only a few examples of separation distances are described herein and labeled in the figures, it should be understood that other separation distances could be achieved by coupling the clips 202 to different combinations of first apertures 240.

In some examples, the pair of guide channels 238 includes a first guide channel 238A extending from a corresponding side portion (e.g., the first side portion 232) and a second guide channel 238B extending from the second side portion 234. The guide channels 238 couple a latch component 206 to the base component 204, as will be described in greater detail below with reference to FIGS. 2E and 3A. It may be noted that the first side portion 232 and the second side portion may be referred to as a pair of side portions. Each guide channel of the pair guide channels 238 has a U-shaped receptacle 244, which may allow the base component 204 to receive and slidably move the latch component 206 relative to the base component 204 between a latched position and an unlatched position.

In some examples, the plurality of slots 242 are disposed spaced apart from each other along the width of the of the adjustable mounting bracket assembly 200. In particular, each of the plurality of slots 242 are disposed along a mid-axis extending along the length of the base component 204. Further, each slot 242 among the plurality of slots 242 has a width, a thickness, and a length which may be equal to a width and a length of a tab 256 (as shown in FIG. 2D) of the device holder 208.

Figure 2D:
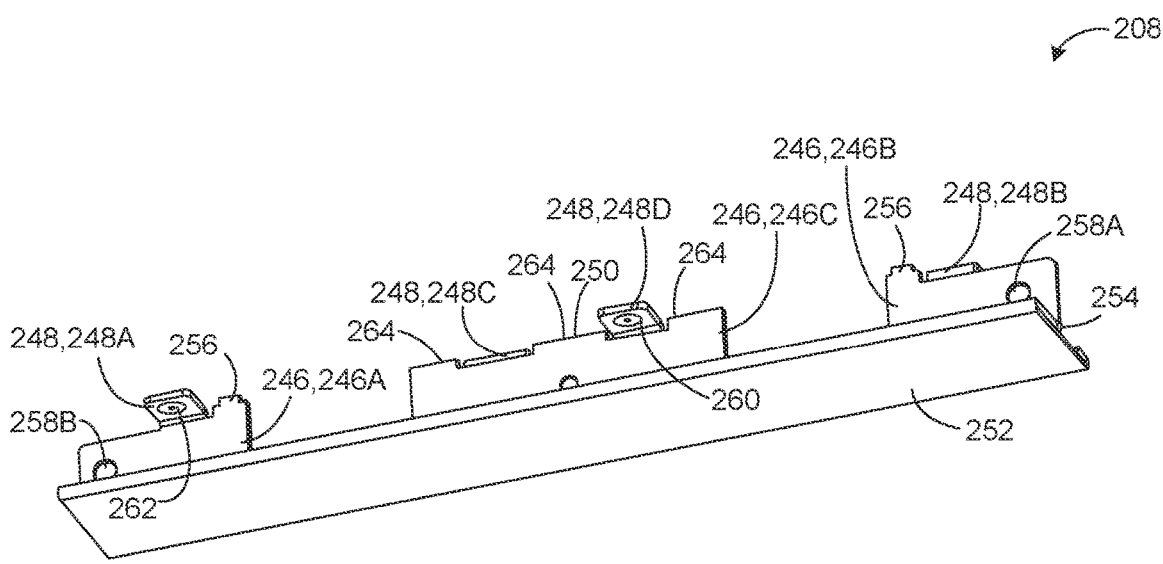
FIG. 2D illustrates a perspective view of a device holder of the adjustable mounting bracket assembly of FIG. 2A according to an example of the present disclosure.

Turning to FIG. 2D, the device holder 208 may be a load holding element of the adjustable mounting bracket assembly 200. In some examples, the device holder 208 includes a plurality of pillars 246, one or more support flanges 248 coupled to one end 250 of each pillar of the plurality of pillars 246, and a flange (e.g., a mounting flange 252) coupled to opposite end 254 of each pillar of the plurality of pillars 246. In some examples, the opposite end 254 of each pillar of the plurality of pillars 246 may be coupled to a mid-axis of the mounting flange 252, extending along the length of the device holder 208. The plurality of pillars 246 includes a first pillar 246A, a second pillar 246B, and a mid-pillar 246C disposed between the first pillar 246A and the second pillar 246B. Each of the first pillar 246A and the second pillar 246B may include a protruded section forming a tab 256. In some examples, the width, thickness, and the length of each tab 256 may be equal to the width, the thickness, and the length of a corresponding slot among the plurality of receiving slots 242 (as shown in FIG. 2C). Each tab 256 may extend into a corresponding slot of the plurality of slots 242 (as shown in FIG. 2C) to couple the device holder 208 to the base component 204. In some examples, the first pillar 246A and the second pillar 246B includes a first locking hole 258A and a second locking hole 258B (or a locking opening) respectively. In some examples, the first locking hole 258A may be configured to lock the latch component 206 to the device holder 208 in the latched position. Similarly, the second locking hole 258B may be used to lock the electronic device 600 to the adjustable mounting bracket assembly 200. The first pillar 246A and the second pillar 246B further includes a first support flange 248A and a second support flange 248B. The mid-pillar 246C includes a third support flange 248C and a fourth support flange 248D. Further, each of the first, second, third, and fourth support flanges 248A, 248B, 248C, 248D may include a hole 260 and a rivet 262 disposed in a corresponding hole 260. In one or more examples, the rivet 262 may protrude beyond the corresponding support flange 248 and contact the base component 204 to maintain a gap between the base component 204 and the device holder 208 so as to allow the latch component 206 to move between the latched and unlatched positions. A plurality of remaining sections 264 of the mid-pillar 246C may contact the base component 204 to provide support to the base component 204 at its center region.

Figure 2E:
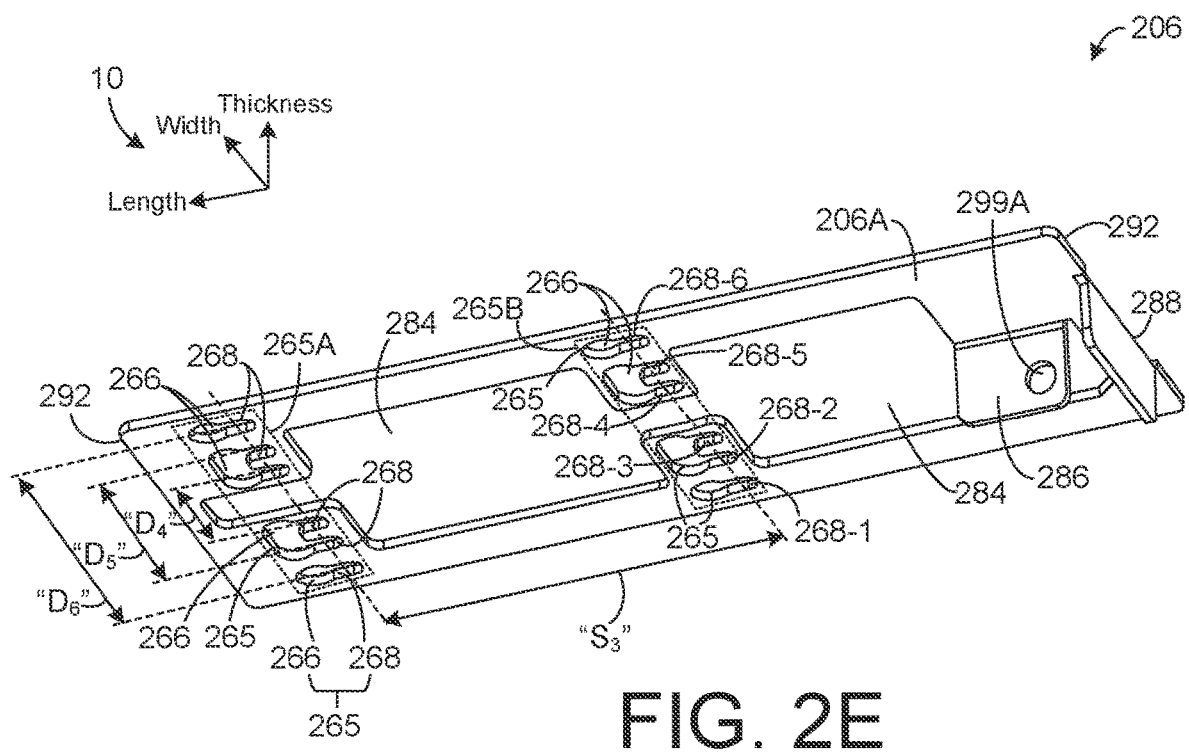
FIG. 2E illustrates a perspective view of a latch component of the adjustable mounting bracket assembly of FIG. 2A according to an example of the present disclosure.

Turning to FIG. 2E, the latch component 206 may be a locking element of the adjustable mounting bracket assembly 200. In such examples, the latch component 206 includes a base 206A having a plurality of keyholes 265. Each of the keyholes 265 includes a second aperture 266 and an engagement slot 268 extending from the second aperture 266. The latch component 206 also includes an opening 284. In particular, each of the plurality of second apertures 266, the plurality of engagement slots 268, and the opening 284 are through-holes extending between an inner surface and outer surface (not labeled) of the base 206A. As shown in FIG. 2E, in some examples two or more keyholes 265 may share a common second aperture 266. In other words, in some examples a single second aperture 266 may be part of multiple keyholes 265 and thus may have multiple engagement slots 268 extending therefrom. The latch component 206 further includes a locking flange 286 and a handle 288 extending downwards from the base 206A.

Each of the keyholes 265 corresponds to one of the first apertures 240 and is located to be vertically aligned with the corresponding first aperture 240. Moreover, specifically, when the latch component 206 is in the unlatched position, the second aperture 266 of each keyhole 265 is vertically aligned with the corresponding first apertures 240 such that if one of the locking knobs 212 is extending through the corresponding first aperture 240, the locking knob 212 also extends through the second aperture 266. In examples, in which a second aperture 266 is shared by multiple keyholes 265, the second aperture 266 is aligned with each of the first apertures 240 corresponding to the multiple keyholes 265. Moreover, when the latch component 206 is in the latched position, the engagement slot 268 is vertically aligned with the corresponding first aperture 240, such that if one of the locking knobs 212 is extending through the corresponding first aperture 240, the locking knob 212 also extends through the engagement slot 268. Accordingly, the keyholes 265 may be arranged in a similar positional arrangement as the first apertures 240. Thus, in the example illustrated in FIG. 2E, the keyholes 265 are arranged in a first set of keyholes 265A corresponding to the first set of first apertures 240A, and a second set of keyholes 265B corresponding to the second set of first apertures 240B, and the separation distance "$S_3$" between these sets along the length dimension may be equal to the separation distances "$S_1$" and "$S_2$" described above. In addition, separation distances between engagement slots 268 along the width dimension may be the same as separation distances between corresponding first apertures 240. For example, the engagement slots 268-3 and 268-4 may be separated by a distance "$D_4$" equal to the distance "$D_1$", the engagement slots 268-2 and 268-5 may be separated by a distance "$D_5$" equal to the distance "$D_2$", and the engagement slots 268-1 and 268-6 may be separated by a distance "$D_6$" equal to the distance "$D_3$".

The opening 284 is formed between a pair of peripheral end portions 292 of the base 206A. In particular, the opening 284 is formed between the first and second sets of keyholes 265A, 265B. Further, the opening 284 extends towards one of the peripheral end portions 292 by protruding between the third and fourth engagement slots 268-3, 268-4 in the first set of keyholes 265A and towards another one of the peripheral end portions 292 by protruding between the third and fourth engagement slots 268-3, 268-4 in the second set of keyholes 265B.

The locking flange 286 extends downwards from a mid-axis (not labeled) of the base 206A. In some examples, the locking flange 286 has a threaded hole 299A. The handle 288 extends downwards from the mid-axis of the base 206A. In particular, the handle 288 is disposed at one of the peripheral end portions 292 of the base 206A.

Figure 2F:
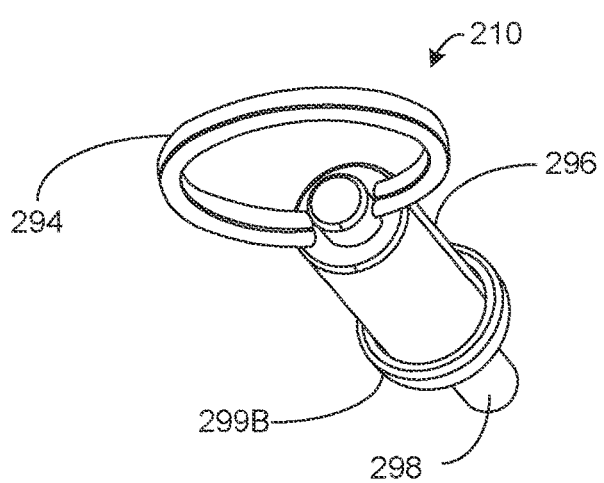
FIG. 2F illustrates a perspective view of a spring-loaded pin of the adjustable mounting bracket assembly of FIG. 2A according to an example of the present disclosure.

Referring to FIG. 2F, the spring-loaded pin 210 includes a handle portion 294, a body portion 296, and a locking pin 298. The body portion 296 interconnects the handle portion 294 to the locking pin 298. In particular, the body portion 296 includes a spring (not shown) connected to the handle portion 294 and the locking pin 298 in an uncompressed condition. In other words, in the uncompressed condition of the spring, the spring pushes the locking pin 298 to protrude beyond the body portion 296. In such examples, when the handle portion 294 is pulled, the spring may get compressed against the body portion 296 and allow the locking pin 298 to retract inside the body portion 296. A section of the body portion 296 has counter-threads 299B, which may be engaged with the threaded hole 299A of the locking flange 286 to couple the spring-loaded pin 210 to the latch component 206.

Referring back to FIG. 2A, the latch component 206 may be slidably inserted into the pair of guide channels 238 of the base component 204. The tab 256 in the device holder 208 may be coupled to the corresponding slot of the plurality of slots 242 of the base component 204 to couple the device holder 208 to the base component 204. In such examples, the mid-pillar 246C is disposed between in the opening 284 and allows the latch component 206 to move relative to the base component 204 and the device holder 208 between the latched position and the unlatched position without interfering the device holder 208. In the unlatched position of the latch component 206, the plurality of first apertures 240 in the base component 204 may be aligned to the corresponding second apertures of the plurality of second apertures 266 in the latch component 206, thereby allowing the locking knobs 212 of the pair of clips 202 to extend through subsets of the first apertures 240 and corresponding subsets of the keyholes 265 to releasably couple the pair of clips 202 to the base component 204. The method of assembling the adjustable mounting bracket assembly 200 is explained in detail in the example of FIGS. 3A-3C.

FIG. 3A depicts a perspective view of an assembly of a base component 204 and a latch component 206 of an adjustable mounting bracket assembly 200. FIG. 3B depicts a perspective view of an assembly of the base component 204 having the latch component 206 of FIG. 3A and a device holder 208. FIG. 3C depicts a perspective bottom view of the adjustable mounting bracket assembly 200 having a pair of clips 202, the base component 204, the latch component 206, the device holder 208, and a spring-loaded pin 210. In the description hereinafter, FIGS. 3A-3C are described concurrently for ease of illustration.

Referring to FIG. 3A, the latch component 206 is slidably inserted into the base component 204 from one of the peripheral end portions 236 of the base component 204. In particular, the latch component 206 is disposed between the pair of guide channels 238 of the base component 204 and pushed lengthwise to insert the latch component 206 within the base component 204. In such examples, the latch component 206 may slide into the base component 204 until the plurality of second apertures 266 in the latch component 206 is aligned to the plurality of first apertures 240 in the base component. In other words, the latch component 206 is pushed until it reaches the unlatched position.

Referring to FIG. 3B, the device holder 208 is coupled to the base component 204. For example, at least some of the plurality of pillars 246 protrudes throughthrough the opening 284 and contacts the base component 204. In particular, the device holder 208 is disposed along the opening 284 of the latch component 206 such that the mid-pillar 246C and the second pillar 246B of the device holder 208 are located within the opening 284, whereas the first pillar 246A is located outside the opening 284. In such examples, the one or more support flanges 248 of the plurality of pillars 246 may contact the base component 204 via the corresponding rivet 262 to provide support to the base component 204. Further, the plurality of remaining sections 264 of the mid-pillar 246C contacts the base component 204 to provide support to the base component 204. In one or more examples, the tabs 256 of the device holder 208 (e.g., the protruded sections at the ends of the first pillar 246A and the second pillar 246B) is pushed into a corresponding slot 242 of the pair of slots 242 to couple the device holder 208 to the base component 204. Since the mid-pillar 246C and the second pillar 246B are disposed along the opening 284 of the latch component 206 and coupled to the base component 204, the opening 284 may allow the latch component 206 to move relative to the base component 204 and the device holder 208, between the latched position and the unlatched position without interfering the mid-pillar 246C and the second pillar 246B of the device holder 208. In some examples, the second pillar 246B of the device holder 208 is disposed behind the locking flange 286 of the latch component 206, when the device holder 208 is coupled to the base component 204.

The spring-loaded pin 210 is further coupled to the latch component 206. In particular, the counter-threads 299B in the body portion 296 of the spring-loaded pin 210 may be engaged with the threaded hole 299A of the locking flange 286 to couple the spring-loaded pin 210 to the latch component 206. In such examples, the locking pin 298 (as shown in FIG. 2F) of the spring-loaded pin 210 contacts the second pillar 246B of the device holder 208 and is held in the compressed state by the second pillar 246B.

Figure 4:
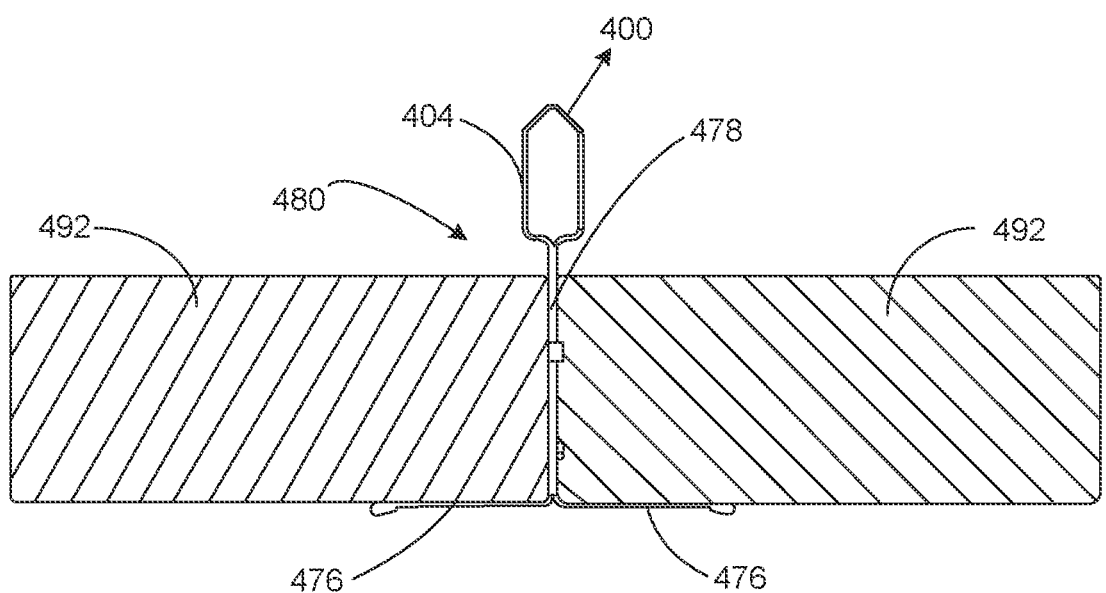
FIG. 4 illustrates a cross-sectional view of a ceiling suspension system.

Referring to FIG. 3C, the pair of clips 202 is releasably coupled to the base component 204. In particular, the locking knobs 212 of each clip 202 is configured to be received within one of the plurality of first apertures 240 and the corresponding second aperture 266 of the plurality of second apertures 266 (as shown in FIG. 3A). In some examples, the pair of clips 202 are disposed spaced apart from each other based on the width of a beam 476 (as shown in FIG. 4). For example, the clips 202 may first be engaged with the beam 476 (as shown in FIG. 4), which determines a needed spacing for the clips 202, and then the clips 202 may be attached to the base component 204 by selecting attachment positions that match the needed spacing for the clips 202. Further, each clip 202 of the pair of clips is inserted into a pair of first apertures 240 and a corresponding pair of keyholes 265 that correspond to the selected attachment position for the clip 202. More specifically, each of the locking knobs 212 of the clip 202 is inserted, by motion along a vertical direction, through one of the first apertures 240 and through the second aperture 266 of a corresponding keyhole 265 aligned with the first aperture 240. In other words, the pair of clips 202 are disposed in subsets of the plurality of first apertures 240 and subsets of the plurality of second apertures 266 to allow the pair of clips 202 to be attached to the base component 204 in one of a plurality of configurations including different separation distances (e.g., "$D_1$", "$D_2$", "$D_3$") between the pair of clips 212 based on the width of the beam 476. Later, the latch component 206 is slidably pushed lengthwise into the base component 204 along a first direction 20 (perpendicular to the vertical direction) to move the latch component 206 from the unlatched position (as shown in FIG. 3A) to the latched position to attach the pair of clips 202 to the base component 204. In some examples, when the latch component 206 is pushed to the latched position, the body portion 228 (as shown in FIG. 2B) of each locking knob 212 slides laterally (parallel to first direction 20) out of the second aperture 266 through which it was previously inserted and into the engagement slot 268 extending from the second aperture 266. Thus, in the latched position of the latch component 206, each locking knob 212 is engaged to the engagement slots 268 that extends from the second aperture 266 through which the locking knob 212 was previously inserted. In particular, when the latch component 206 is in the latched position, the body portion 228 (as shown in FIG. 2B) of a given one of the locking knobs 212 protrudes through a given one of the plurality of first apertures and through a given one of the plurality of engagement slots 268, and the head portion 226 (e.g., rim section 226A) of the given one of the locking knobs 212 engages with a rim 268-R of the given one of the plurality of engagement slots 268 to prevent removal of the given one of the locking knobs 212 from the given one of the plurality of first apertures 240, thereby allowing the latch component 206 to latch the pair of clips 202 to the base component 204. Further, when the latch component 206 is moved to the latched position, the locking pin 298 of the spring-loaded pin 210 engages with the first locking hole 258A of the device holder 208 to retain the latch component 206 in the latched position.

FIG. 4 depicts a cross-sectional view of a ceiling suspension system 400. The ceiling suspension system 400 includes a ceiling grid 480 defined by a plurality of beams 476. Each of the plurality of beams 476 is disposed between a pair of ceiling panels 492 to support the pair of ceiling panels 492. In the illustrated examples, the pair of ceiling panels 492 is square lay-in panels. In some other examples, the pair of ceiling panels 492 may be tegular panels without deviating from the scope of the present disclosure. In some examples, the pair of clips 202 (as shown in FIG. 2B) may be disposed spaced apart from each other and mounted to the plurality of beams 476 depending on the width/shape of each beam of the plurality of beams 476.

Figure 5B:
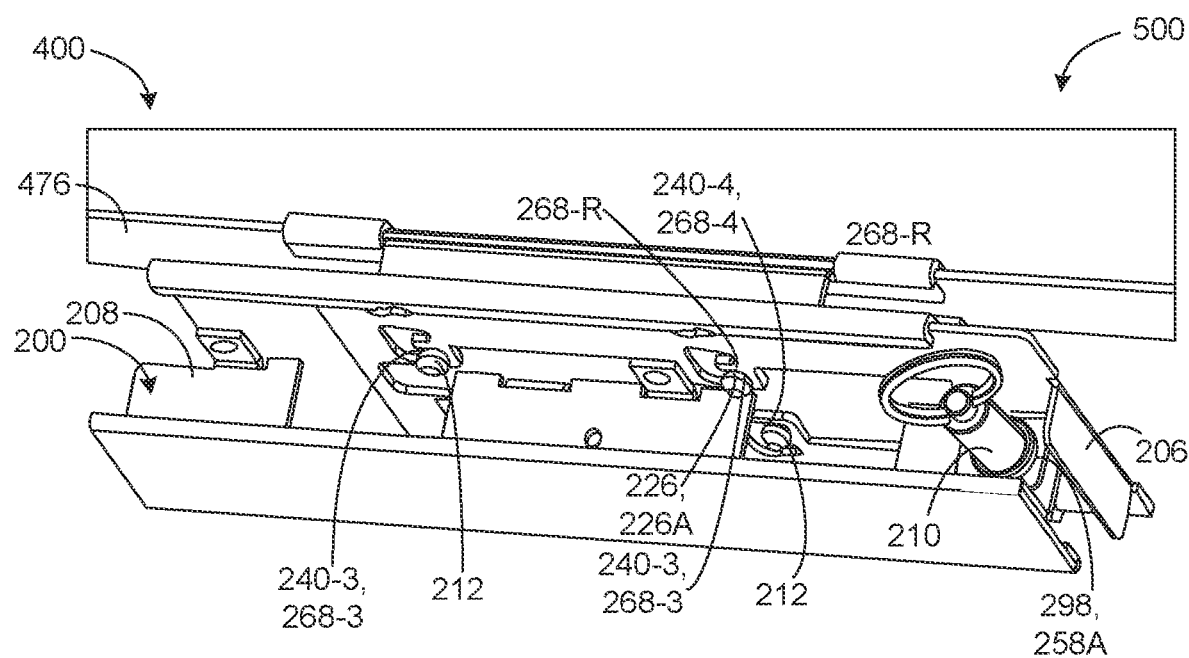
FIG. 5B illustrates an assembled perspective view of the ceiling suspension assembly of FIG. 5A according to the example of present disclosure.

FIG. 5A depicts an exploded perspective view of a ceiling suspension assembly 500. FIG. 5B depicts an assembled perspective view of the ceiling suspension assembly 500 of FIG. 5A. In the description hereinafter, FIGS. 5A-5B are described concurrently for ease of illustration. The ceiling suspension assembly 500 includes a ceiling suspension system 400 of FIG. 4 and an adjustable mounting bracket assembly 200 of FIG. 3C. As discussed herein, the ceiling suspension system 400 (as shown in FIG. 5A) includes beams 476 and a hanger 478 that suspends the beams 476 from a ceiling (not shown). The adjustable mounting bracket assembly 200 includes a pair of clips 202, a base component 204, a latch component 206, a device holder 208, and a fastener (e.g., a spring-loaded pin 210).

Referring to FIG. 5A, the pair of clips 202 are detachably coupled to the beams 476. In particular, each clip 202 of the pair of clips 202 includes a hook 216 (e.g., guide recess) engaged to opposite edges 476A of each beam 476 to releasably couple the pair of clips 202 to the ceiling suspension system 400. In some examples, the pair of clips 202 are later coupled to the base component 204 to mount the adjustable mounting bracket assembly 200 to the ceiling suspension system 400. In particular, the pair of clips 202 are disposed spaced apart from each other depending on the width of the beam 476, and the locking knobs 212 are aligned with the plurality of first apertures 240 and the plurality of second apertures 266. In particular, the locking knobs 212 of the first clip 202A are aligned with a) the third pair of first apertures defined by the apertures 240-3 from the first and second sets of first apertures 240A, 240B of the first apertures 240 and b) the third pair of second apertures defined by the apertures 266-3 from the first and second sets of keyholes 265A, 265B of the keyholes 265. Similarly, the locking knobs 212 of the second clip 202B are aligned with a) the fourth pair of first apertures defined by the apertures 240-4 from the first and second sets of first apertures 240A, 240B of the first apertures 240 and b) the fourth pair of second apertures defined by the apertures 266-3 from the first and second sets of keyholes 265A, 265B of the keyholes 265.

Referring to FIG. 5B, initially, the locking knob 212 of each clip of the pair of clips 202 is inserted into corresponding the plurality of first apertures 240 and the plurality of second apertures 266 (e.g., the third pair of first and second apertures and the fourth pair of first and second apertures) in the unlatched position of the latch component 206. In other words, in the unlatched position, each aperture of the plurality of second apertures 266-3 in the third pair of second apertures is aligned with the corresponding first aperture of the plurality of first apertures 240-3 in the third pair of first apertures to allow the locking knobs 212 from the first clip 202A to passthrough the first and second apertures 240-3, 266-3. Similarly, in the unlatched position, each aperture of the plurality of second apertures 266-4 in the fourth pair of second apertures is aligned with the corresponding first aperture of the plurality of first apertures 240-4 in the fourth pair of first apertures to allow the locking knobs 212 from the second clip 202B to passthrough the first and second apertures 240-4, 266-4. Later, the latch component 206 is moved from the unlatched position to the latched position to allow the locking knobs 212 to engage with corresponding engagement slot of the plurality of engagement slots 268. In particular, when the latch component 206 is moved from the unlatched position to the latched position: a) the first clip 202A slides to engage with the engagement slots 268-3 from the third pair of engagement slots and b) the second clip 202B slides to engage with the engagement slots 268-4 from the fourth pair of engagement slots, and thereby attach the pair of clips 202 to the base component 204 in one of a plurality of configurations including different separation distances (e.g., "$D_1$") between the pair of clips 202 based on the width of the beam 476. In other words, in the latched position of the latch component 206, the engagement slots 268-3, 268-4 engage with the locking knobs 212 and prevent removal of the locking knobs 212 from the first apertures 240-3, 240-4. In particular, the body portion 228 (as shown in FIG. 2B) of a given one of the locking knobs 212 protrudes through a given one of the plurality of first apertures 240 and through a given one of the plurality of engagement slots 268 and the head portion 226 (e.g., a rim section 226A) of the given one of the locking knobs 212 engages with a rim 268-R of the given one of the plurality of engagement slots 268 to prevent removal of the given one of the locking knobs 212 from the given one of the plurality of first apertures 240. In some examples, a fastener (e.g., a locking pin 298 of the spring-loaded pin 210) of the latch component 206 engage with a locking hole (e.g., a first locking hole 258A) formed in the device holder 208 to retain the latch component 206 in the latched position.

Figure 6B:
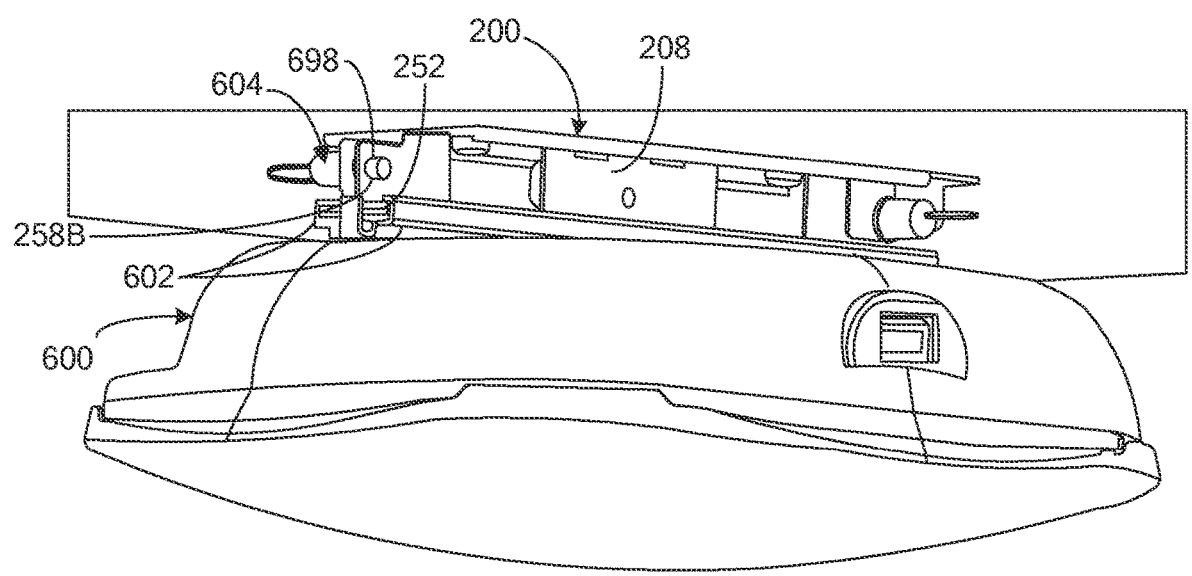
FIG. 6B illustrates an assembled perspective view of the electronic device to the ceiling suspension assembly of FIG. 5B according to the example of the present disclosure.

FIG. 6A depicts a partially assembled perspective view of an electronic device 600 and a ceiling suspension assembly 500 of FIG. 5B. FIG. 6B depicts an assembled perspective view of the electronic device 600 and the ceiling suspension assembly 500 of FIG. 5B. In the description hereinafter, FIGS. 6A-6B are described concurrently for ease of illustration. As discussed herein, the ceiling suspension assembly 500 includes an adjustable mounting bracket assembly 200 and a ceiling suspension system 400. The ceiling suspension system 400 includes a plurality of beams 476 and a hanger 478 that suspends the plurality of beams 476 from the main ceiling (not shown). The adjustable mounting bracket assembly 200 includes a pair of clips 202, a base component 204, a latch component 206, a device holder 208, and a spring-loaded pin 210.

In some examples, the electronic device 600 is an access point (AP). In some other examples, the electronic device 600 may be a switch, a router, or the like. The electronic device 600 includes a pair of guide grooves 602 and a fastener (e.g., a second spring-loaded pin 604). The pair of guide grooves 602 is coupled to a top portion of the electronic device 600. In one or more examples, the pair of guide grooves 602 defines a receptacle for receiving the mounting flange 252 of the device holder 208, and thereby couple the electronic device 600 to the adjustable mounting bracket assembly 200.

The second spring-loaded pin 604 is similar to the spring-loaded pin 210 of FIG. 2F. Hence, the second spring-loaded pin 604 is not discussed in greater details herein for the sack of brevity of the disclosure. The second spring-loaded pin 604 is disposed over the pair of guide grooves 602 and may be aligned with the second locking hole 258B of the device holder 208, when the electronic device is coupled to the device holder 208. As discussed in the example of FIG. 2F, the second spring-loaded pin 604 includes a second locking pin 698, which in the uncompressed condition protrudes beyond a body 696 of the second spring-loaded pin 604 and in the compressed condition retracts within the body 696 of the second spring-loaded pin 604.

It may be noted herein that FIG. 6B does not shown the ceiling suspension system 400 for ease of illustration and such non-illustration of the ceiling suspension system 400 should not be construed as a limitation of the present disclosure. Referring to FIG. 6B, the pair of guide grooves 602 is engaged completely with the flange 252 to couple the electronic device 600 to the adjustable mounting bracket assembly 200. In such examples, when the electronic device 600 is coupled to the adjustable mounting bracket assembly 200, the second locking pin 698 of the second spring-loaded pin 604 moves to the uncompressed state, thereby allowing the second spring-loaded pin 604 to protrude into second locking hole 258B of the device holder 208 to retain the electronic device 600 in the adjustable mounting bracket assembly 200.

Figure 7:
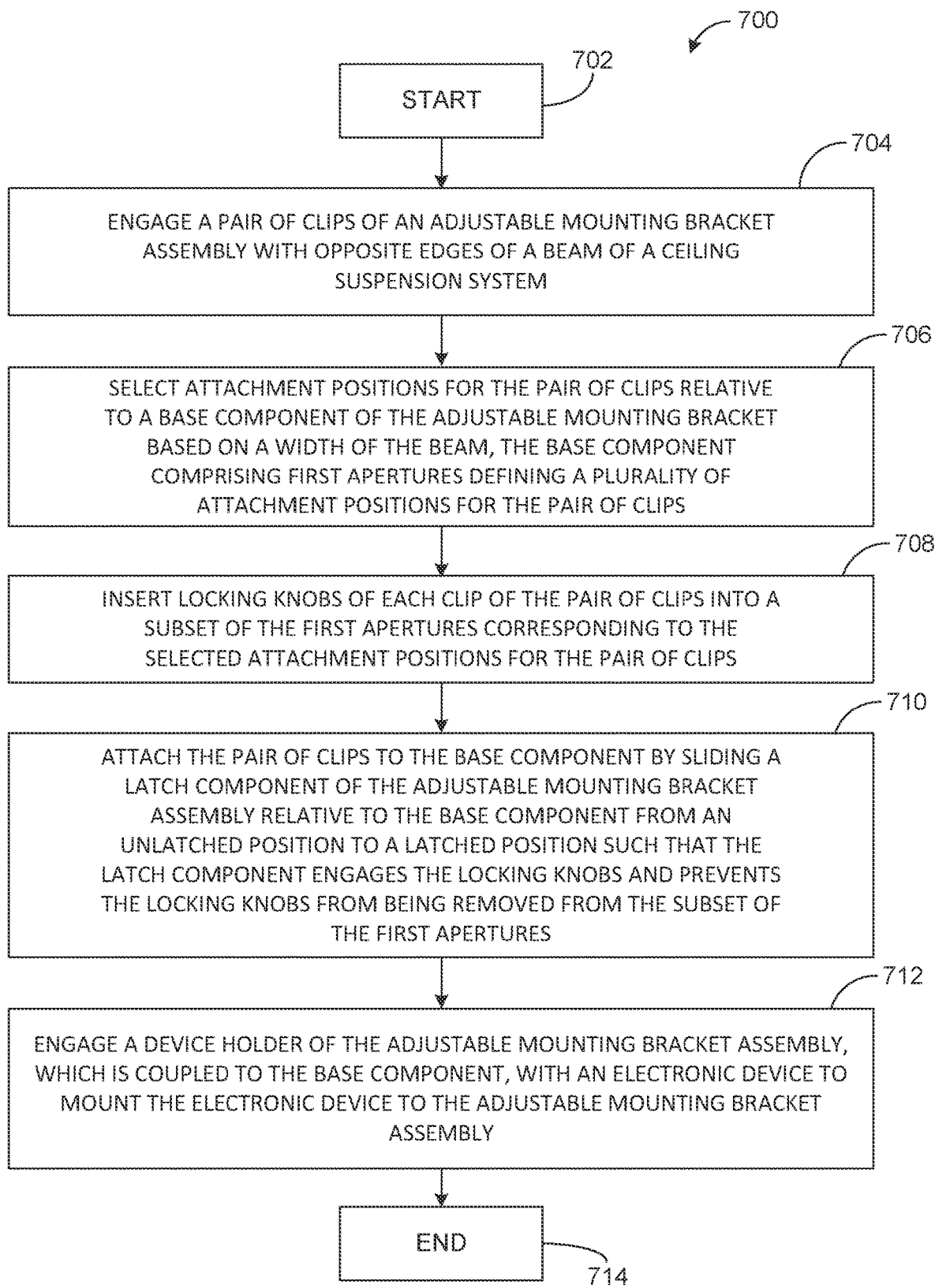
FIG. 7 is a flowchart depicting a method of mounting an electronic device to a ceiling suspension system using an adjustable mounting bracket assembly according to one example of the present disclosure.

FIG. 7 depicts a flowchart depicting a method 700 of mounting an electronic device to a ceiling suspension system using an adjustable mounting bracket assembly. It may be noted herein that the method 700 is described in conjunction with FIGS. 2A-2F, 3A-3C, 4A-4B, 5A-5B, and 6A-6B for example. The method 700 starts at block 702 and continues to block 704.

At block 704, the method 700 includes engaging a pair of clips of an adjustable mounting bracket assembly with opposite edges of a beam of a ceiling suspension system. In some examples, each clip of the pair of clips includes a hook (e.g., a guide recess) to receive the beam and mount the pair of clips to the ceiling suspension system. The method 700 continues to block 706.

At block 706, the method 700 includes selecting attachment positions for the pair of clips relative to a base component of the adjustable mounting bracket based on a width of the beam. In some examples, the pair of clips may be disposed spaced apart from each other based on the width/shape of the beam. In particular, the base component includes first apertures defining a plurality of attachment positions for the pair of clips. Accordingly, in one or more examples, the first apertures arranged along a width of the base component may allow the pair of clips to be attached to the base component in a plurality of configurations including different separation distances between the pair of clips. The method 700 continues to block 708.

At block 708, the method 700 includes inserting locking knobs of each clip of the pair of clips into a subset of the first apertures corresponding to the selected attachment positions for the pair of clips. In some examples, the subset of the first apertures may include a first pair of first apertures, a second pair of first apertures, and a third pair of first apertures, a fourth pair of first apertures, a fifth pair of first apertures, and a sixth pair of first apertures. The third and fourth pairs of first apertures define a first separation distance, the second and fifth pairs of first apertures define a second separation distance, and the first and sixth pairs of first apertures define a third separation distance. In some examples, inserting the locking knobs of each clip into the subset of first apertures further includes inserting locking knobs further into a subset of second apertures in a latch component disposed in an unlatched position. In some examples, the latch component is slidably disposed into a guide channel of the base component and moved to the unlatched position, where the first apertures in the base component is aligned with second apertures of the latch component. In particular, the second apertures may include a first pair of second apertures aligned to the first pair of first apertures, a second pair of first apertures aligned to the second pair of first apertures, and a third pair of second apertures aligned to the third pair of first apertures, a fourth pair of second apertures aligned to the fourth pair of first apertures, a fifth pair of second apertures aligned to the fifth pair of first apertures, and a sixth pair of second apertures aligned to the sixth pair of first apertures. In such examples, as the locking knobs of each clip are inserted into the first apertures, the locking knobs further pass through a corresponding subset of second apertures of the latch component. The method continues to block 710.

At block 710, the method 700 includes attaching the pair of clips to the base component by sliding the latch component relative to the base component from the unlatched position to a latched position such that the latch component engages the locking knobs and prevents the locking knobs from being removed from the subset of the first apertures. In particular, when the latch component is further moved from the unlatched position to the latched position, the locking knobs of each clip slides into a corresponding engagement slot of engagement slots of the latch component and engages with the corresponding engagement slot to retain the pair of clips to the base component. As the latch component slides from the unlatched position to the latched position, a body portion of a given one of the locking knobs protrudes through a given one of first apertures and through a given one of engagement slots of the latch component, and a head portion of the given one of the locking knobs engages with a rim of the given one of the engagement slots to prevent removal of the given one of the locking knobs from the given one of the first apertures. In one or more examples, each engagement slot of the engagement slots extends from at least one the second aperture. In such examples, each engagement slot and the corresponding second aperture may be collectively referred to as a keyhole of the latch component. In some examples, the method 700 further includes engaging a fastener (e.g., a spring-loaded pin) of the latch component with a locking hole formed in the device holder to retain the latch component in the latched position. The method continues to block 712.

At block 712, the method 700 includes engaging a device holder of the adjustable mounting bracket assembly, which is coupled to the base component, with an electronic device to mount the electronic device to the adjustable mounting bracket assembly. In some examples, the device holder includes a flange which engages with a pair of guide grooves of the electronic device to allow mounting of the electronic device to the adjustable mounting bracket assembly. In some examples, the method 700 further includes engaging a fastener (e.g., a second spring-loaded pin) of the electronic device with a second locking hole (or opening) formed in the device holder to retain the electronic device to the adjustable mounting bracket assembly. The method 700 ends at block 714.

Since the adjustable mounting bracket assembly may be easily assembled to make it compatible with multiple widths of beams, the adjustable mounting bracket provides flexibility, upgradability, serviceability, and reduced costs, and supply chain benefits. In particular, there may be no need to maintain or produce different types of adjustable mounting bracket, each having different types of mounting features, and therefore the costs associated with designing and producing multiple types of brackets can be avoided. In addition, the number of SKUs that are needed can be reduced and the need to maintain different inventories thereof can be avoided, which can in turn decrease costs. Further, since the various mounting features of the adjustable mounting bracket are designed as one of sliding fixtures or spring-loaded pins, the adjustable mounting bracket may not require tools or special fixtures to mount the electronic device to the ceiling suspension system. Hence, the adjustable mounting bracket is inexpensive to assemble, maintain, and replace.

In the foregoing description, various directional or spatial-relational terms were used, such as vertical, up, down, lateral, etc. It should be understood that these terms are used in relation to the orientations shown in the figures but are not intended to limit the orientations of the devices or systems relative to some external reference frame in which the devices or systems may be deployed. For example, "vertical" as used herein refers to a direction parallel to the thickness dimension as illustrated in various figures, but this direction does not necessarily have to be aligned with a "vertical" direction as defined relative to a building in which the devices or systems are deployed. For example, if the bracket is mounted to a wall (rather than a ceiling), directions described herein as vertical may be oriented horizontally relative to the reference frame containing the wall.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. An adjustable mounting bracket assembly for mounting an electronic device to a ceiling suspension system, comprising:
    a pair of clips configured to mount to a beam of the ceiling suspension system by being engaged with opposite edges of the beam, respectively, with the clips spaced apart from one another along a width dimension of the beam, the width dimension extending between the opposite edges, each clip comprises locking knobs;
    a base component comprising a plurality of first apertures, wherein each of the locking knobs is configured to be received within one of the plurality of first apertures to attach the clips to the base component, and the plurality of first apertures are arranged to allow the clips to be attached to the base component in a plurality of configurations comprising different separation distances between the clips compatible with different beam widths, and wherein, in a mounted state of the clips to the beam, the locking knobs are insertable into a subset of the plurality of first apertures such that the clips are in one of the plurality of configurations in which the separation distance between the clips is compatible with the width of the beam; and
    a device holder coupled to the base component, wherein the device holder is configured to mount the electronic device to the adjustable mounting bracket assembly.

2. The adjustable mounting bracket assembly of claim 1, further comprising:
    a latch component coupled to the base component and movable between a latched position and an unlatched position, wherein the latch component is configured to, in a state of the locking knobs received within the plurality of first apertures:

engage with the locking knobs in the latched position to attach the pair of clips to the base component, and disengage from the locking knobs in the unlatched position to allow removal of the pair of clips from the base component.

3. The adjustable mounting bracket assembly of claim 2, wherein the base component further comprises a pair of guide channels, each guide channel extending along a corresponding side portion of a pair of side portions of the base component, and wherein the latch component is slidably coupled to the base component by the pair of guide channels.

4. The adjustable mounting bracket assembly of claim 2, wherein the latch component comprises a plurality of engagement slots arranged so as to align with the plurality of first apertures, respectively, in the latched position of the latch component, wherein at least some of the plurality of engagement slots engage with the locking knobs in the latched position and prevent removal of the locking knobs from the plurality of first apertures.

5. The adjustable mounting bracket assembly of claim 4, wherein the latch component further comprises a plurality of second apertures each configured to allow one of the locking knobs to be passed therethrough,
wherein each of the plurality of engagement slots extends from one of the plurality of second apertures, and wherein, when the latch component is in the unlatched position, each of the plurality of second apertures is aligned with at least one of the plurality of first apertures to allow for passing of the locking knobs through the plurality of first apertures and the plurality of second apertures.

6. The adjustable mounting bracket assembly of claim 5, wherein, each of the locking knobs has a body portion and a head portion, and when the latch component is in the latched position, the body portion of a given one of the locking knobs protrudes through a given one of the plurality of first apertures and through a given one of the plurality of engagement slots and the head portion of the given one of the locking knobs engages with a rim of the given one of the plurality of engagement slots to prevent removal of the given one of the locking knobs from the given one of the plurality of first apertures.

7. The adjustable mounting bracket assembly of claim 2, wherein the latch component further comprises a fastener configured to engage with a locking hole formed in the device holder to retain the latch component in the latched position.

8. The adjustable mounting bracket assembly of claim 2, wherein the device holder comprises a flange and a plurality of pillars coupled to the flange and the base component, wherein the latch component comprises an opening that allows at least some of the plurality of pillars to protrude through the opening and contact the base component, and wherein the opening further allows the latch component to move relative to the base component and the device holder between the latched position and the unlatched position without interfering the device holder.

9. The adjustable mounting bracket assembly of claim 8, wherein the flange is configured to engage with a pair of guide grooves of the electronic device to mount the electronic device to the adjustable mounting bracket assembly.

10. The adjustable mounting bracket assembly of claim 9, wherein, in a state of the electronic device being mounted to the adjustable mounting bracket assembly, a fastener of the electronic device is configured to engage with a locking opening formed in the device holder to retain the electronic device in the adjustable mounting bracket assembly.

11. The adjustable mounting bracket assembly of claim 1, wherein the plurality of first apertures is disposed spaced apart from each other along the width of the adjustable mounting bracket assembly to allow the pair of clips to have different separation distances depending on which combinations of the plurality of first apertures receive the locking knobs.

12. The adjustable mounting bracket assembly of claim 1, wherein each clip comprises a hook that is configured to engage with the beam to mount the adjustable mounting bracket assembly to the ceiling suspension system.

13. A ceiling suspension assembly for mounting the electronic device comprising:
the ceiling suspension system comprising a ceiling grid defined by a plurality of beams, where each of the plurality of beams is disposed between a pair of ceiling panels to support the pair of ceiling panels; and
the adjustable mounting bracket assembly of claim 1, wherein the pair of clips are configured to engage with one of the plurality of beams.

14. A mountable electronic system comprising:
the adjustable mounting bracket assembly of claim 1; and
the electronic device coupled to, or configured to be coupled to, the device holder of the adjustable mounting bracket assembly.

15. A method comprising:
engaging a pair of clips of an adjustable mounting bracket assembly with opposite edges of a beam of a ceiling suspension system;
selecting attachment positions for the pair of clips relative to a base component of the adjustable mounting bracket based on a width of the beam, the base component comprising first apertures defining a plurality of attachment positions for the pair of clips;
inserting locking knobs of each clip of the pair of clips into a subset of the first apertures corresponding to the selected attachment positions for the pair of clips;
attaching the pair of clips to the base component by sliding a latch component of the adjustable mounting bracket assembly relative to the base component from an unlatched position to a latched position such that the latch component engages the locking knobs and prevents the locking knobs from being removed from the subset of the first apertures; and
engaging a device holder of the adjustable mounting bracket assembly, which is coupled to the base component, with an electronic device to mount the electronic device to the adjustable mounting bracket assembly.

16. The method of claim 15, wherein, as the locking knobs of each clip are inserted into the first apertures, the latch component is in the unlatched position and the locking knobs further pass through a corresponding subset of second apertures of the latch component.

17. The method of claim 16, wherein, as the latch component slides from the unlatched position to the latched position, a body portion of a given one of the locking knobs protrudes through a given one of first apertures and through a given one of engagement slots of the latch component, and a head portion of the given one of the locking knobs engages with a rim of the given one of the engagement slots to prevent removal of the given one of the locking knobs from the given one of the first apertures, and wherein each of the engagement slots extends from one of the second apertures.

18. The method of claim 17, further comprising engaging a fastener of the latch component with a locking hole formed in the device holder to retain the latch component in the latched position.

19. The method of claim 15, wherein engaging the device holder with the electronic device comprises engaging a flange of the device holder with a pair of guide grooves of the electronic device to allow mounting of the electronic device to the adjustable mounting bracket assembly.

20. The method of claim 19, further comprising engaging a fastener of the electronic device with a locking opening formed in the device holder to retain the electronic device to the adjustable mounting bracket assembly.

* * * * *